US012645148B2

(12) United States Patent
Lu et al.

(10) Patent No.: US 12,645,148 B2
(45) Date of Patent: Jun. 2, 2026

(54) EXTREME ULTRAVIOLET (EUV) RADIATION SOURCE APPARATUS, EUV LITHOGRAPHY SYSTEM, AND METHOD FOR GENERATING EXTREME ULTRAVIOLET RADIATION

(71) Applicant: TAIWAN SEMICONDUCTOR MANUFACTURING COMPANY LTD., Hsinchu (TW)

(72) Inventors: Chien-Hsing Lu, Tainan City (TW); Chih-Chiang Tu, Taoyuan City (TW); Chih-Wei Wen, Tainan City (TW); Hsin-Fu Tseng, Hsinchu County (TW); Tzu Jeng Hsu, Taoyuan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 272 days.

(21) Appl. No.: 18/455,655

(22) Filed: Aug. 25, 2023

(65) Prior Publication Data

US 2024/0369939 A1     Nov. 7, 2024

Related U.S. Application Data

(60) Provisional application No. 63/499,971, filed on May 3, 2023.

(51) Int. Cl.
*G03F 7/00*          (2006.01)

(52) U.S. Cl.
CPC ...... *G03F 7/70191* (2013.01); *G03F 7/70033* (2013.01)

(58) Field of Classification Search
CPC ............. G03F 7/70033; G03F 7/70191; G03F 7/70575; G03F 7/70916
See application file for complete search history.

(56) References Cited

U.S. PATENT DOCUMENTS 10,638,588 B2 *   4/2020   Vinokhodov .......... H05G 2/002
12,133,318 B2 *  10/2024   Bykanov .............. H05G 2/0035
(Continued)

FOREIGN PATENT DOCUMENTS

CN          113767715 A      12/2021
TW          202236001 A       9/2022

OTHER PUBLICATIONS

U.S. Pat. No. 10,887,973 B2 is the US counterpart of CN 113767715 A.

(Continued)

*Primary Examiner* — Deoram Persaud
(74) *Attorney, Agent, or Firm* — WPAT LAW; Anthony King

(57) ABSTRACT

An EUV radiation source apparatus includes an EUV source vessel; a tin layer disposed in the EUV source vessel; a chamber disposed adjacent to the EUV source vessel; and a first filter disposed in the chamber, wherein the first filter includes a membrane and a mesh disposed on the membrane, and the membrane and the mesh are integrally formed. A method for generating EUV radiation includes: forming a first filter including a membrane and a mesh integrally formed with the membrane; disposing the first filter in a chamber adjacent to an EUV source vessel; and collecting fuel debris on the first filter in the chamber.

20 Claims, 14 Drawing Sheets

(56) References Cited

U.S. PATENT DOCUMENTS

| | | | |
|---|---|---|---|
| 2006/0160031 A1* | 7/2006 | Wurm | G21K 1/10 |
| | | | 430/394 |
| 2011/0024651 A1* | 2/2011 | Schimmel | G21K 1/10 |
| | | | 250/503.1 |
| 2014/0085619 A1* | 3/2014 | Banine | G02B 1/11 |
| | | | 355/71 |
| 2017/0146902 A1* | 5/2017 | Lairson | G21K 1/10 |
| 2019/0115184 A1* | 4/2019 | Zalubovsky | H01J 35/101 |
| 2020/0060014 A1* | 2/2020 | Vinokhodov | H05G 2/0094 |
| 2020/0064184 A1* | 2/2020 | Miyashita | G03F 7/20 |
| 2020/0163197 A1* | 5/2020 | Ivanov | G03F 7/70916 |
| 2022/0276553 A1 | 9/2022 | Nikipelov et al. | |
| 2023/0324814 A1* | 10/2023 | Huang | G03F 7/70916 |
| 2024/0369936 A1* | 11/2024 | Tseng | G03F 7/70033 |

OTHER PUBLICATIONS

U.S. Pat. No. 11,415,879 B1 is the US counterpart of TW 202236001 A.

* cited by examiner

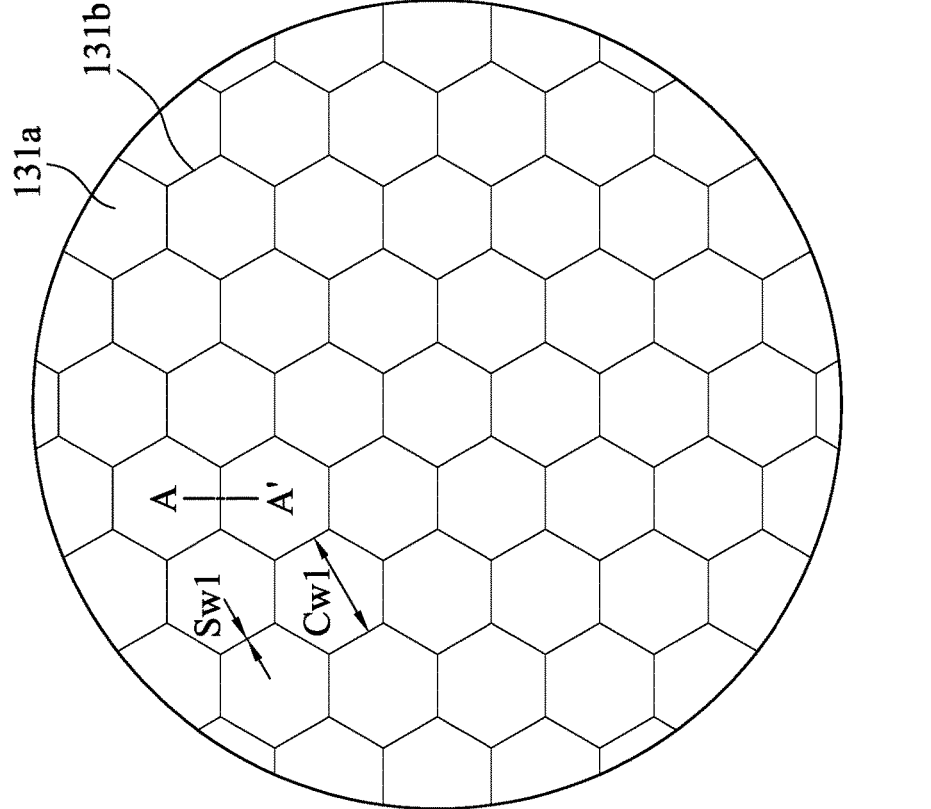
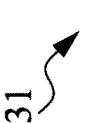
FIG. 3

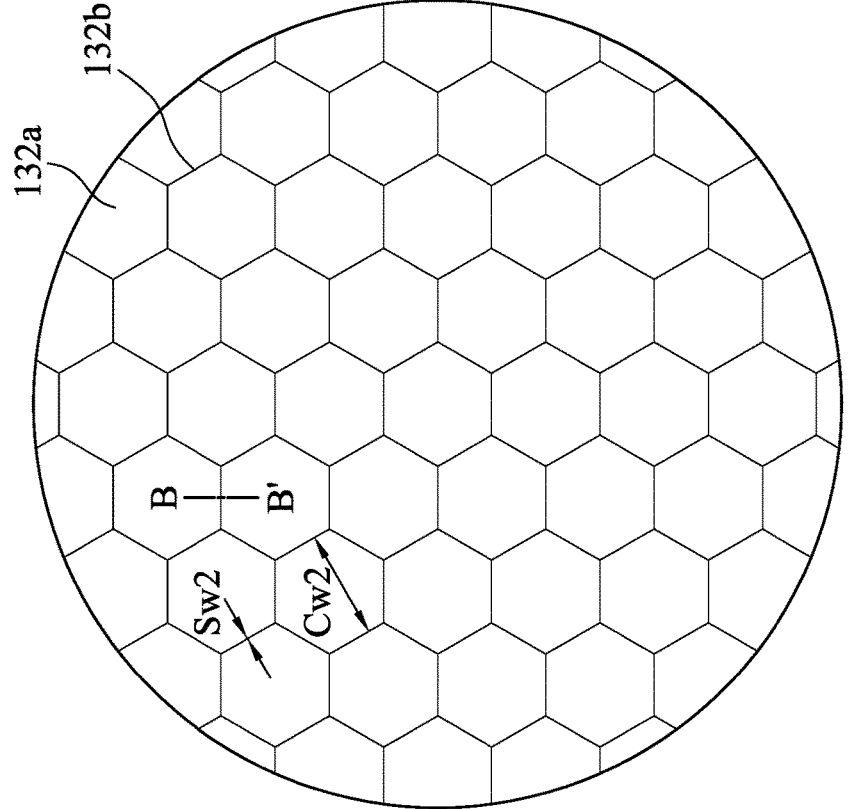
FIG. 7

200

201

Forming a first filter including a membrane and a mesh integrally formed with the membrane

202

Disposing the first filter in a chamber adjacent to an EUV source vessel

203

Collecting fuel debris on the first filter in the chamber

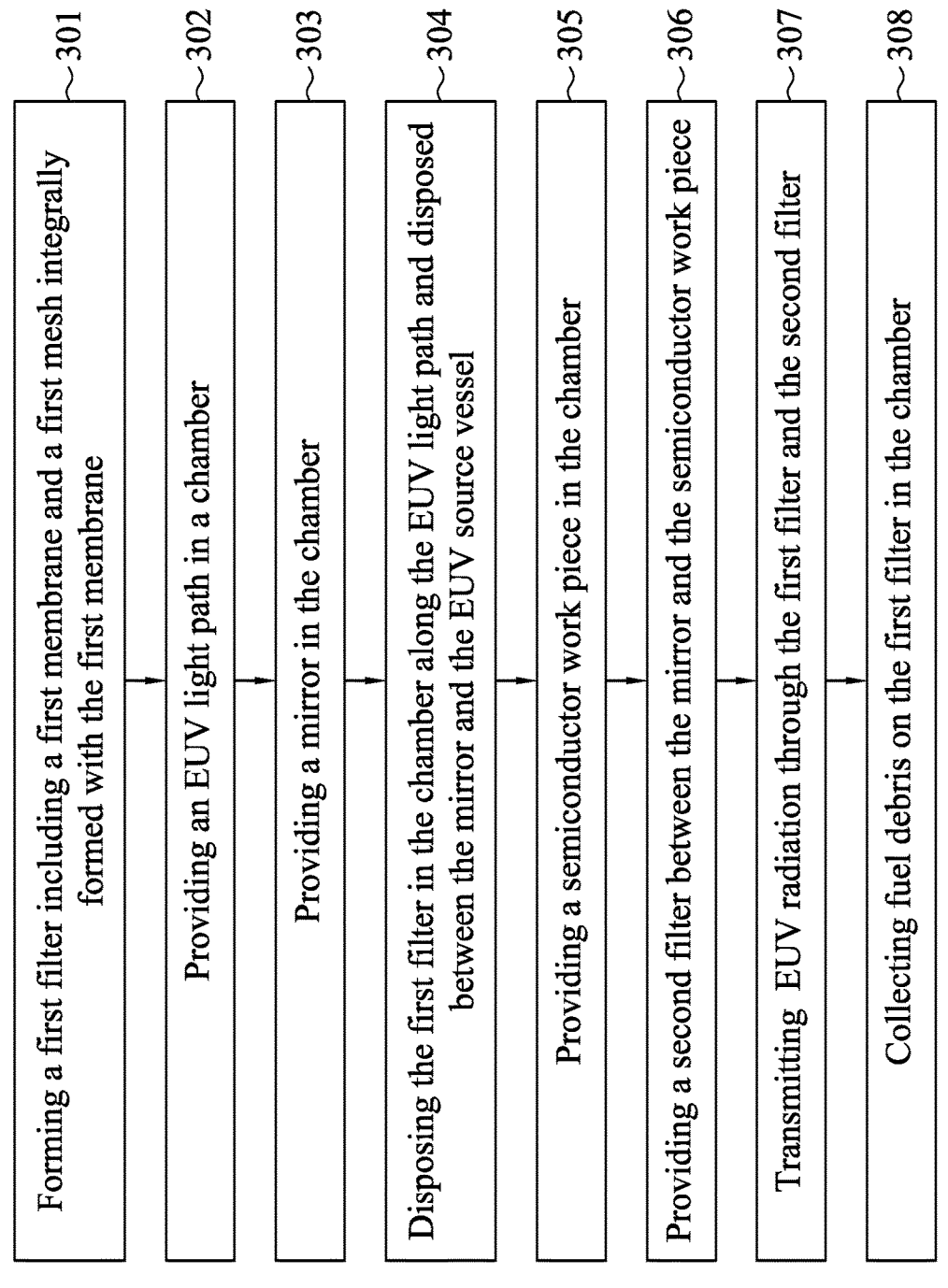

300

Forming a first filter including a first membrane and a first mesh integrally formed with the first membrane —301

Providing an EUV light path in a chamber —302

Providing a mirror in the chamber —303

Disposing the first filter in the chamber along the EUV light path and disposed between the mirror and the EUV source vessel —304

Providing a semiconductor work piece in the chamber —305

Providing a second filter between the mirror and the semiconductor work piece —306

Transmitting EUV radiation through the first filter and the second filter —307

Collecting fuel debris on the first filter in the chamber —308

FIG. 11

EXTREME ULTRAVIOLET (EUV) RADIATION SOURCE APPARATUS, EUV LITHOGRAPHY SYSTEM, AND METHOD FOR GENERATING EXTREME ULTRAVIOLET RADIATION

CROSS-REFERENCE TO RELATED APPLICATIONS

This application claims the benefit of U.S. Provisional Application No. 63/499,971, filed May 3, 2023, the entire disclosure of which is incorporated by reference herein.

BACKGROUND

Extreme ultraviolet (EUV) radiation, e.g., electromagnetic radiation having wavelengths of around 50 nm or less, and including light having a wavelength of about 13.5 nm, can be used in photolithography processes to produce extremely small features in substrates such as silicon wafers. Methods for generating EUV radiation include converting a fuel material from a liquid state into a plasma state. In the plasma state, the fuel material emits photons having a desired wavelength, which comprise the EUV radiation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a schematic view of a first filter of an EUV radiation source apparatus according to aspects of the present disclosure in some embodiments.

FIG. 7 is a schematic view of a second filter of an EUV radiation source apparatus according to aspects of the present disclosure in some embodiments.

FIG. 11 is a flowchart of a method for generating EUV radiation in accordance with some embodiments of the present disclosure.

DETAILED DESCRIPTION

Figure 1:
FIG. 1 is a schematic view of an EUV radiation source apparatus in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "over," "upper." "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first." "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially." "approximately" and "about" generally mean within a value or range that can be contemplated by people having ordinary skill in the art. Alternatively, the terms "substantially." "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially." "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, an extreme ultraviolet (EUV) radiation source apparatus and a method for generating EUV radiation are provided. In some embodiments, the EUV radiation source apparatus includes an EUV source vessel, a tin layer disposed in the EUV source vessel, a chamber disposed adjacent to the EUV source vessel, and a first filter disposed in the chamber. The first filter includes a membrane and a mesh disposed on the membrane, and the membrane and the mesh are integrally formed. The first filter mitigates fuel debris, provides spectral purity filtering, or both. As a result, the EUV radiation source apparatus is protected from the debris, and stabilization and service life of the EUV radiation source apparatus are improved.

A method for generating EUV radiation according to some embodiments of the present disclosure includes forming a first filter including a membrane and a mesh integrally formed with the membrane; disposing the first filter in a chamber adjacent to an EUV source vessel; and collecting fuel debris on the first filter in the chamber. Other features and processes may also be included.

In some embodiments, the method for generating EUV radiation generally includes providing a laser beam directed toward a tin layer disposed in an EUV source vessel. As the laser beam strikes the tin layer, the tin layer is heated to a critical temperature and fuel debris is formed in the EUV source vessel. The collision of the laser beam and the tin layer causes atoms of the tin layer to shed their electrons and form a plasma of ionized fuel. The plasma of ionized fuel emits photons having a wavelength less than 50 nm, which comprise the EUV radiation, and the EUV radiation can be directed through an exit port of the EUV source vessel.

In some embodiments, the fuel debris from the collision may splash around in the EUV source vessel and even escape the EUV source vessel and into a chamber. Cleaning of the chamber is a time-consuming process that requires stopping generation of the EUV radiation. In some embodiments, a first filter disposed in the chamber is configured to collect the fuel debris and transmit the EUV radiation toward a mirror in the chamber and onto a semiconductor workpiece.

FIG. 1 is a schematic view of an EUV radiation source apparatus 100 in accordance with some embodiments of the present disclosure. In some embodiments, referring to FIG. 1, the EUV radiation source apparatus 100 includes an EUV source vessel 101, a chamber 102 and a first filter 131. In some embodiments, the EUV source vessel 101 is disposed adjacent to and communicable with the chamber 102.

Figure 2:
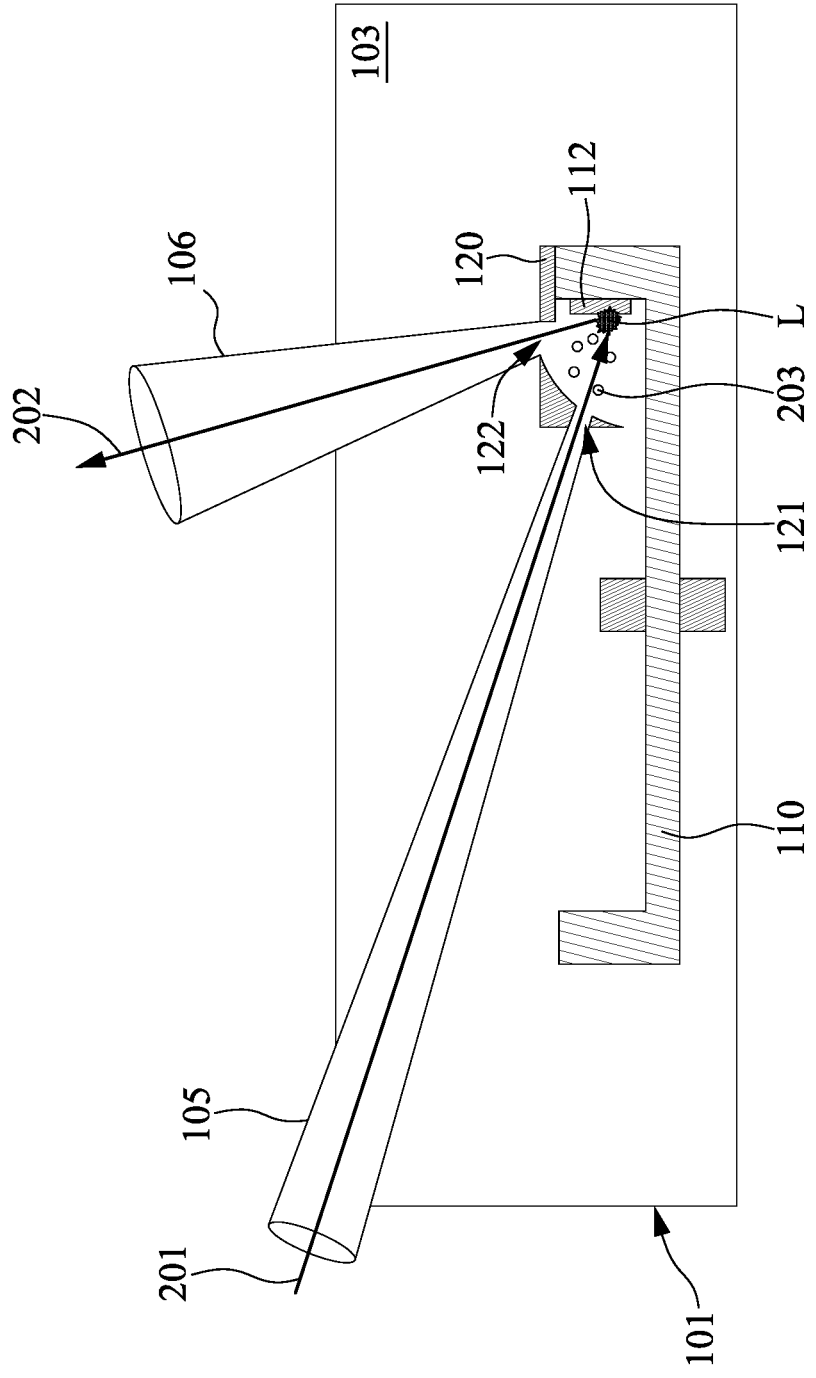
FIG. 2 is a schematic view of an EUV source vessel of an EUV radiation source apparatus according to aspects of the present disclosure in some embodiments.

FIG. 2 is a schematic view of an EUV source vessel of an EUV radiation source apparatus according to aspects of the present disclosure in some embodiments. In some embodiments, referring to FIGS. 1 and 2, the EUV radiation source apparatus 100 includes a crucible 110 disposed in the EUV source vessel 101, and a tin layer 112 disposed on the crucible 110. In some embodiments, the EUV radiation source apparatus 100 further includes a catcher 120 disposed in the EUV source vessel 101 and configured to collect fuel debris 203 generated from a collision of a laser beam 201 and the tin layer 112.

In some embodiments, the EUV source vessel 101 is configured to receive the crucible 110, the tin layer 112, the catcher 120, and the fuel debris 203. The EUV source vessel 101 is configured to direct a generated EUV radiation 202 out of the EUV source vessel 101 toward a first mirror 141, but the disclosure is not limited thereto. In some embodiments, the EUV source vessel 101 is held in a vacuum state (e.g., at a pressure of less than $10^{-2}$ mbar). In some embodiments, the EUV source vessel 101 is a high-vacuum chamber. A size, a material and a configuration of the EUV source vessel 101 are not particularly limited, and may be adjusted according to actual needs. In some embodiments, the configuration of the EUV source vessel 101 may be adjusted in order to increase efficiency of generating the EUV radiation 202. In some embodiments, the EUV source vessel 101 has a round or oval shape from a top view.

In some embodiments, the crucible 110 disposed in the EUV source vessel 101 is rotatable. In some embodiments, the crucible 110 is rotatable in a clockwise or a counter-clockwise direction. In some embodiments, the crucible 110 is rotated at a predetermined interval. In some embodiments, the tin layer 112 is disposed on the crucible 110 and may be rotatable along with the crucible 110.

In some embodiments, the tin layer 112 is attached to the crucible 110. In some embodiments, the tin layer 112 is disposed on an inner sidewall 110a of the crucible 110. In some embodiments, the tin layer 112 is ring-shaped.

In some embodiments, the catcher 120 is configured to collect the fuel debris 203 generated from the collision of the laser beam 201 and the tin layer 112. In some embodiments, a functionality of the EUV radiation source apparatus 100 may be improved since the catcher 120 catches some of the fuel debris 203.

In some embodiments, the catcher 120 is disposed over the tin layer 112 and the crucible 110. In some embodiments, the tin layer 112 is disposed between the catcher 120 and the crucible 110. In some embodiments, a location L, where the fuel debris 203 is generated, is located between the tin layer 112 and the catcher 120. In some embodiments, the catcher 120 catches some of the fuel debris 203 generated at the location L. In some embodiments, the catcher 120 is spaced apart from the tin layer 112. In some embodiments, the fuel debris 203 collected by the catcher 120 may flow to the crucible 110. In some embodiments, the catcher 120 is disposed over at least a portion of the tin layer 112 from a top view. A shape of the catcher 120 may be adjusted according to actual factors, such as various configurations of the tin layer 112 and the crucible 110.

In some embodiments, the catcher 120 includes a first aperture 121 configured to be an entrance port of the laser beam 201 to allow the laser beam 201 to be directed toward the tin layer 112. In some embodiments, the catcher 120 includes a second aperture 122 configured to be an exit port of the EUV radiation 202. However, some of the fuel debris 203 may enter the second aperture 122 of the catcher 120. In some embodiments, the second aperture 122 is disposed adjacent to the first aperture 121. In some embodiments, the first aperture 121 and the second aperture 122 are separated from each other. In some embodiments, the catcher 120 includes only the second aperture 122. In some embodiments, the catcher 120 includes the first aperture 121 and the second aperture 122.

In some embodiments, the EUV source vessel 101 further includes a first channel 105 configured to introduce the laser beam 201 into the EUV source vessel 101 and a second channel 106 configured to allow the EUV radiation 202 to exit the EUV source vessel 101 and enter the chamber 102. In some embodiments, the first channel 105 and the second channel 106 are respectively coupled to the EUV source vessel 101 and in communication with the EUV source vessel 101. In some embodiments, the first channel 105 is disposed adjacent to a first aperture 121 of the catcher 120 and configured to be an entrance port of the laser beam 201 into the EUV source vessel 101. In some embodiments, the second channel 106 is disposed adjacent to the second aperture 122 of the catcher 120 and configured to be an exit port of the EUV radiation 202 out of the EUV source vessel 101.

In some embodiments, the first channel 105 is aimed toward the first aperture 121. In some embodiments, the second channel 106 is aimed toward the second aperture 124. In some embodiments, each of the first channel 105 and the second channel 106 is a cylinder. In some embodiments, each of the first channel 105 and the second channel 106 includes a conical shape, and a tip of the conical shape is coupled to the EUV source vessel 101.

FIG. 3 is a schematic view of a first filter of an EUV radiation source apparatus according to aspects of the present disclosure in some embodiments. In some embodiments, referring to FIGS. 1 and 3, the first filter 131 is disposed within the chamber 102. In some embodiments, an EUV light path 108 traveling along the chamber 102 from the exit port is arranged within the chamber 102, and the first filter 131 is disposed in the EUV light path 108 and configured to allow the EUV radiation 202 to pass through. In some embodiments, the first filter 131 is disposed between the tin layer 112 and the first mirror 141 and configured to collect fuel debris 203 generated from the collision of the laser beam 201 and the tin layer 112. In some embodiments, the first filter 131 is a debris filter and is disposed between the second channel 106 of the EUV source vessel 101 and the first mirror 141. In some embodiments, the first filter 131 includes a first membrane 131a and a first mesh 131b disposed on the first membrane 131a and configured to provide additional protection from damage caused by the fuel debris 203. In some embodiments, the first membrane 131a faces the exit port of the EUV source vessel 101 and is configured to catch the fuel debris 203. In some embodiments, the first mesh 131b faces the exit port of the EUV source vessel 101 and is configured to catch the fuel debris 203. The first filter 131 may be circular, as shown, or may comprise other shapes, such as square, oval, octagonal, pentagonal, or other shapes, and may be adjusted according to the actual needs.

Generally, the materials used for fabrication of the first filter 131 are preferably capable of withstanding high thermal loads. The first membrane 131a preferably comprises a material that is substantially transparent to a first wavelength of light. The first wavelength of light preferably comprises EUV light, e.g., light or radiation having a wavelength of about 10 to 15 nm. In some embodiments, the first wavelength of light is about 13.5 nm. In some embodiments, the first filter 131 includes a material that is at least 80% transparent to the first wavelength of light, and more preferably, the first filter 131 includes a material that is about 95 to 100% transparent to the first wavelength of light. In some embodiments, the first filter 131 is adapted to provide spectral purity filtering of wavelengths of light other than the first wavelength of light. In some embodiments, the first filter 131 provides an additional advantage of significantly reducing radiation that is outside of EUV wavelengths. As such, the first filter 131 can be easily adjusted for use as an EUV spectral purity filter, such as an out-of-band radiation filter.

The material of the first membrane 131a may be opaque to visible light. In some embodiments, the material of the first membrane 131a preferably has a high transparency to the EUV radiation 202. In some embodiments, the material of the first membrane 131a includes silicon. In some embodiments, the first membrane 131a is substantially transparent to the first wavelength of light. The first membrane 131a is relatively thin, yet strong.

In some embodiments, the first mesh 131b includes a material that is structurally strong, in order to provide mechanical support for the first membrane 131a. In some embodiments, the first mesh 131b includes a rigid material patterned in a grid of struts that provides a stabilizing frame for the first membrane 131a. In some embodiments, the first mesh 131b includes materials that are transparent to the EUV radiation 202. In some embodiments, the first mesh 131b includes an array of struts, as shown in FIG. 3. In some embodiments, the pattern of the struts may comprise a square grid, and alternatively may comprise other patterns, such as triangular, rectangular, circular, octagonal, trapezoidal, a honeycomb, or combinations thereof. In some embodiments, the first mesh 131b includes a hexagonal wire mesh. In some embodiments, a cell width Cw1 of the first mesh 131b is between 15 and 20 nm. In some embodiments, a strut width Sw1 of the first mesh 131b is less than 2 nm.

In some embodiments, the first membrane 131a and the first mesh 131b are integrally formed and include a same material. In some embodiments, the first membrane 131a and the first mesh 131b are formed simultaneously by etching a wafer.

Figure 4:
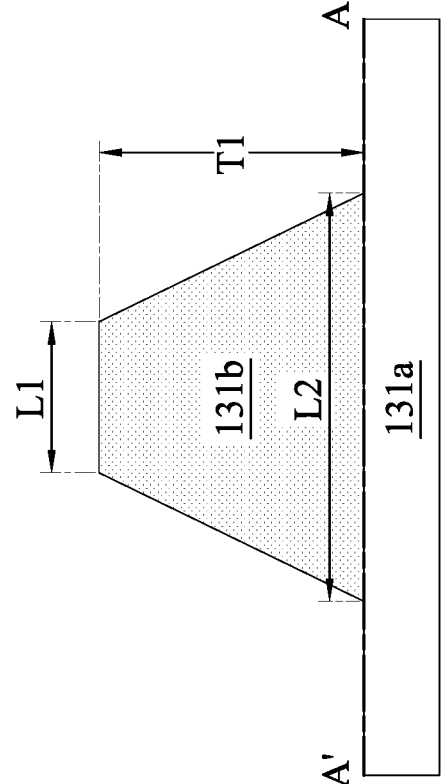
FIGS. 4 and 5 are cross-sectional views of the first filter along line A-A' in FIG. 3.

FIG. 4 is a cross-sectional view of the first filter 131 along line A-A' of FIG. 3. In some embodiments, referring to FIG. 4, the first mesh 131b is formed on the first membrane 131a to increase a mechanical strength of the first filter 131. In some embodiments, a profile of the struts of the first mesh 131b is trapezoidal from the cross-sectional view. In some embodiments, the trapezoidal profile of the struts of the first mesh 131b from the cross-sectional view includes a long base attached to the first membrane 131a and a short base away from the first membrane 131a. In some embodiments, a length L1 of the short base is less than 0.5 nm, a length L2 of the long base is greater than the length L1 of the short base, and the difference between the length L2 of the long base and the length L1 of the short base is less than 1 nm. In some embodiments, a thickness T1 of the first mesh 131b is less than 1 nm.

Figure 5:
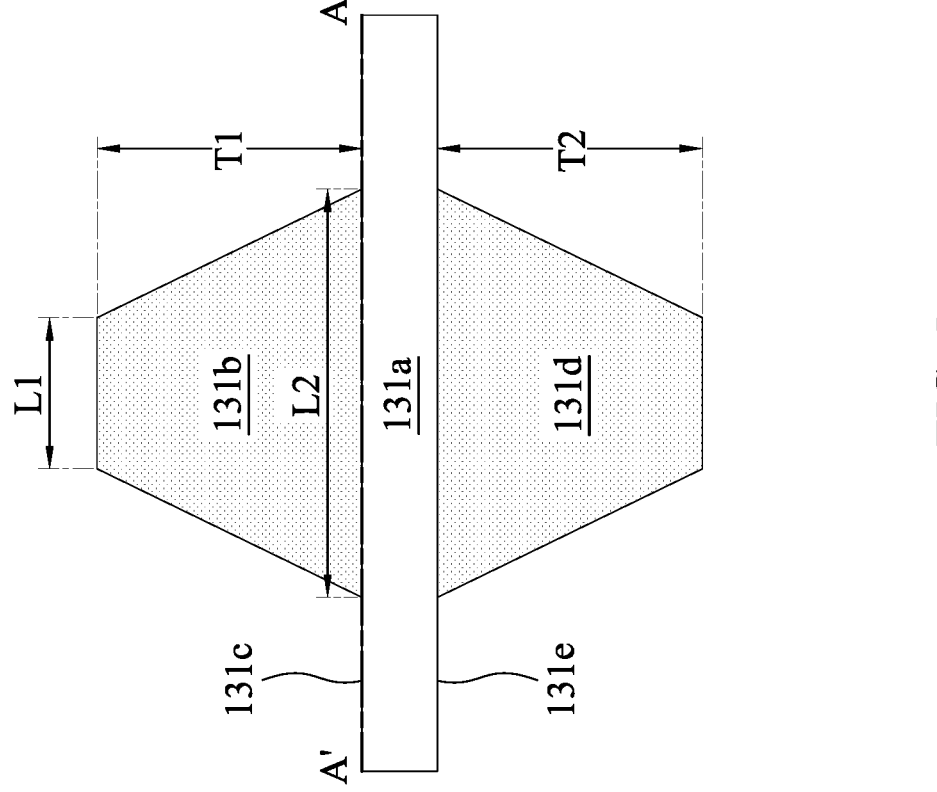

FIG. 5 is a cross-sectional view of the first filter 131 along line A-A' of FIG. 3. In some embodiments, referring to FIG. 5, the first mesh 131b is formed on a first side 131c of the first membrane 131a, and a second mesh 131d is formed on a second side 131e opposite to the first side 131c of the first membrane 131a to increase a mechanical strength of the first filter 131. In some embodiments, a profile of the struts of the second mesh 131d is trapezoidal from the cross-sectional view. In some embodiments, a thickness T2 of the second mesh 131d is less than 1 nm. In some embodiments, the profile of the struts of the second mesh 131d may be similar to or different from the profile of the struts of the first mesh 131b.

Figure 6:
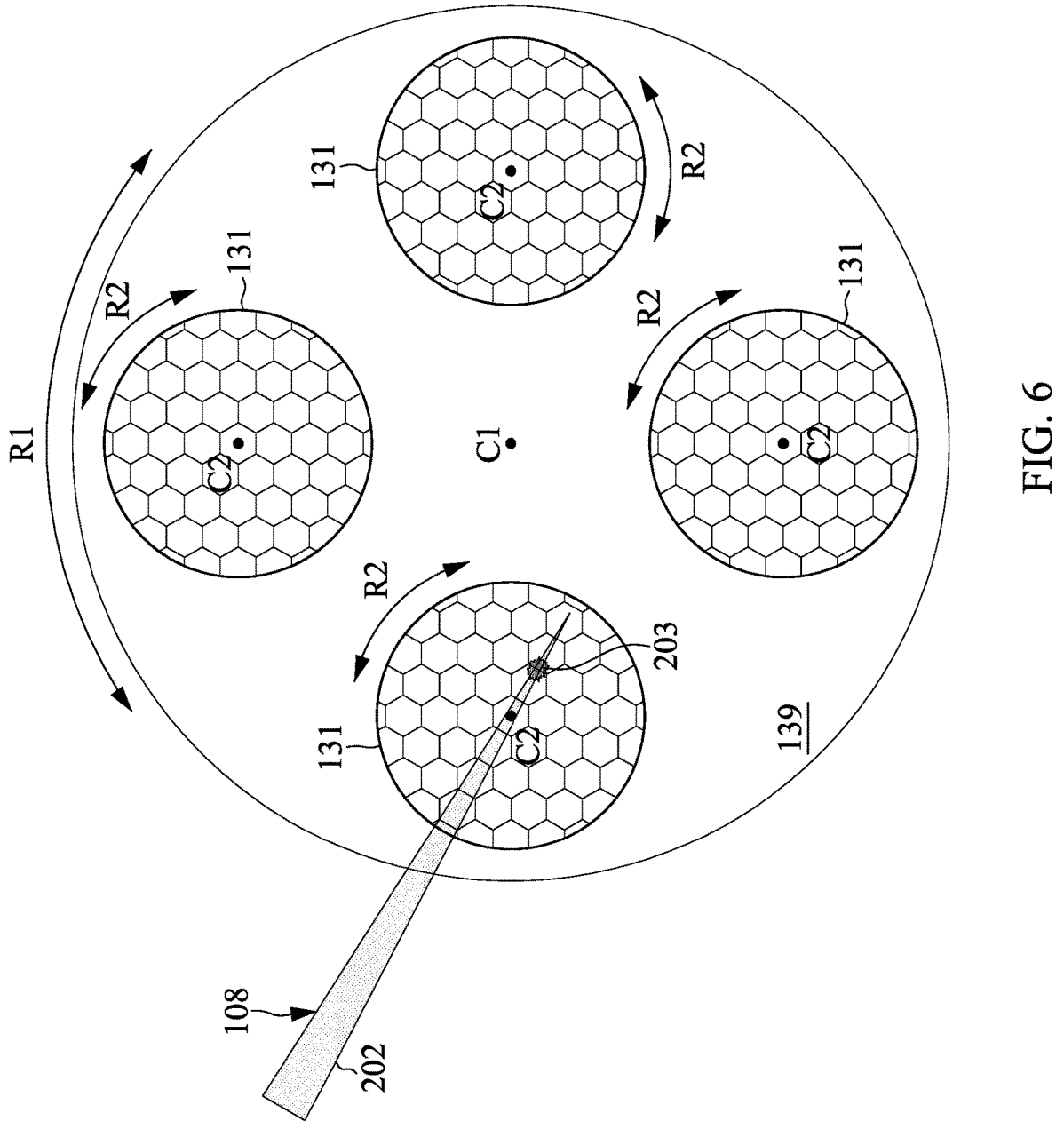
FIG. 6 is a schematic view of a carrier and a plurality of first filters of an EUV radiation source apparatus in accordance with some embodiments of the present disclosure.

FIG. 6 is a schematic view of a carrier 139 and a plurality of first filters 131 of an EUV radiation source apparatus 100 in accordance with some embodiments of the present disclosure. In some embodiments, referring to FIGS. 1 and 6, the EUV radiation source apparatus 100 includes the carrier 139 configured to carry the first filter 131. In some embodiments, the carrier 139 disposed in the chamber 102 is rotatable. In some embodiments, the carrier 139 is rotatable about a first center C1 and in a first direction R1. In some embodiments, the carrier 139 is rotatable in a clockwise or a counter-clockwise direction. In some embodiments, the carrier 139 is rotated at a predetermined interval. In some embodiments, the first filter 131 is disposed on the carrier 139 and may be revolved about the first center C1 and in the first direction R1 along with the carrier 139.

In some embodiments, a plurality of first filters 131 are disposed on and attached to the carrier 139. In some embodiments, the plurality of first filters 131 surround the first center C1. In some embodiments, the first filters 131 disposed on the carrier 139 are rotatable. In some embodiments, each of the first filters 131 is rotatable about a second center C2 and in a second direction R2. In some embodiments, each of the first filters 131 is rotatable in a clockwise or a counter-clockwise direction. The first filters 131 may rotate in same or different directions. In some embodiments, each of the first filters 131 is rotated at a predetermined interval. In some embodiments, each of the first filters 131 disposed on the carrier 139 may be rotatable about the second center C2 and in the second direction R2 respectively. In some embodiments, the carrier 139 and at least one of the first filters 131 disposed on the carrier 139 may rotate separately or simultaneously.

In some embodiments, one of the first filters 131 disposed on the carrier 139 is disposed in the EUV light path 108. When a portion of the first filter 131 has collected some fuel debris 203 and is considered used and contaminated, the first filter 131 rotates at the predetermined interval or rotates about the second center C2, and the fuel debris 203 may be collected by a fresh portion of the first filter 131. In some embodiments, when the first filter 131 in the EUV light path 108 has collected enough fuel debris 203 and is considered used and contaminated, the carrier 139 rotates at the predetermined interval to dispose another first filter 131, which is fresh and unused, in the EUV light path 108. As such, after all first filters 131 have trapped enough fuel debris 203, the plurality of first filters 131 on the carrier 139 may be removed from the chamber 102 at once, and another carrier 139 having a plurality of unused first filters 131 disposed thereon may be moved into the chamber 102. The carrier 139 may be circular, as shown, or may comprise other shapes, such as square, oval, octagonal, pentagonal, or other shapes, and may be adjusted according to the actual needs.

FIG. 7 is a schematic view of a second filter 132 of an EUV radiation source apparatus 100 according to aspects of the present disclosure in some embodiments. In some embodiments, referring to FIGS. 1 and 7, a second mirror 142 is disposed in the chamber 102 and adjacent to the first mirror 141. In some embodiments, the second filter 132 is disposed between the first mirror 141 and the second mirror 142. The second filter 132 is arranged at any location in the EUV light path 108. In some embodiments, the second filter 132 is disposed in the EUV light path 108 and configured to allow the EUV radiation 202 to pass through. In some embodiments, the second filter 132 is an out-of-band radiation filter. In some embodiments, the second filter 132 is disposed at an aperture position.

In some embodiments, the second filter 132 includes a second membrane 132a and a third mesh 132b disposed on the second membrane 132a configured to provide mechanical support. In some embodiments, the second membrane 132a faces opposite to a radiation direction of the EUV radiation 202. In some embodiments, the third mesh 132b faces opposite to the radiation direction of the EUV radiation 202. The second filter 132 may be circular, as shown, or may comprise other shapes, such as square, oval, octagonal, pentagonal, or other shapes, and may be adjusted according to the actual needs.

Generally, materials used for fabrication of the second filter 132 are preferably capable of withstanding high thermal loads. The second membrane 132a preferably comprises a material that is substantially transparent to the first wavelength of light. The first wavelength of light preferably comprises EUV light, e.g., light or radiation having a wavelength of about 10 to 15 nm. In some embodiments, the first wavelength of light is about 13.5 nm. In some embodiments, the second filter 132 includes a material that is at least 80% transparent to the first wavelength of light, and more preferably, the second filter 132 includes a material that is about 95 to 100% transparent to the first wavelength of light. In some embodiments, the second filter 132 is adapted to provide spectral purity filtering of wavelengths of light other than the first wavelength of light. As such, the second filter 132 can be easily adjusted for use as an EUV spectral purity filter, such as an out-of-band radiation filter. In some embodiments, the second filter 132 provides the additional advantage of collecting fuel debris 203 generated from the collision of the laser beam 201 and the tin layer 112 and thus serving as a debris filter.

The material of the second membrane 132a may be opaque to visible light. In some embodiments, the material preferably has a high transparency to the EUV radiation 202. In some embodiments, the material includes silicon, EUV pellicles or zirconium. In some embodiments, the second membrane 132a is substantially transparent to the first wavelength of light. The second membrane 132a is relatively thin, yet strong.

In some embodiments, the third mesh 132b includes a material that is structurally strong, in order to provide mechanical support for the second membrane 132a. In some embodiments, the third mesh 132b includes a rigid material patterned in a grid of struts that provides a stabilizing frame for the second membrane 132a. In some embodiments, the third mesh 132b includes materials that are transparent to the EUV radiation 202. In some embodiments, the third mesh 132b includes an array of struts. In some embodiments, the pattern of the struts may comprise a square grid, or may comprise other patterns, such as triangular, rectangular, circular, octagonal, trapezoidal, a honeycomb, or combinations thereof. In some embodiments, the third mesh 132b includes a hexagonal wire mesh. In some embodiments, a cell width Cw2 of the third mesh 132b is between 15 and 20 nm. In some embodiments, a strut width Sw2 of the third mesh 132b is less than 2 nm.

In some embodiments, the second membrane 132a and the third mesh 132b are integrally formed and include a same material. In some embodiments, the second filter 132 includes silicon, EUV pellicles or zirconium. In some embodiments, the second membrane 132a and the third mesh 132b are formed simultaneously.

Figure 8:
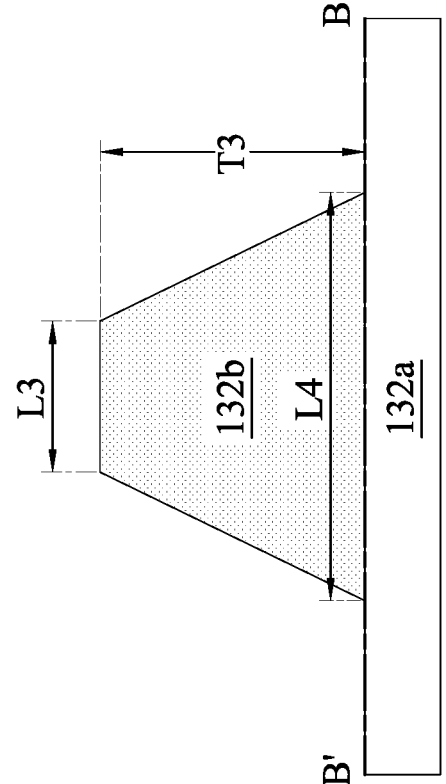
FIGS. 8 and 9 are cross-sectional views of the second filter along line B-B' in FIG. 7.

FIG. 8 is a cross-sectional view of the second filter 132 along line B-B' in FIG. 7. In some embodiments, referring to FIG. 8, the third mesh 132b is formed on the second membrane 132a to increase a mechanical strength of the second filter 132. In some embodiments, a profile of the struts of the third mesh 132b is trapezoidal from the cross-sectional view. In some embodiments, the trapezoidal profile of the struts of the third mesh 132b from the cross-sectional view includes a long base attached to the second membrane 132a and a short base away from the second membrane 132a. In some embodiments, a length L3 of the short base is less than 0.5 nm, a length L4 of the long base is greater than the length L3 of the short base, and the difference between the length L4 of the long base and the length L3 of the short base is less than 1 nm. In some embodiments, a thickness T3 of the third mesh 132b is less than 1 nm.

Figure 9:
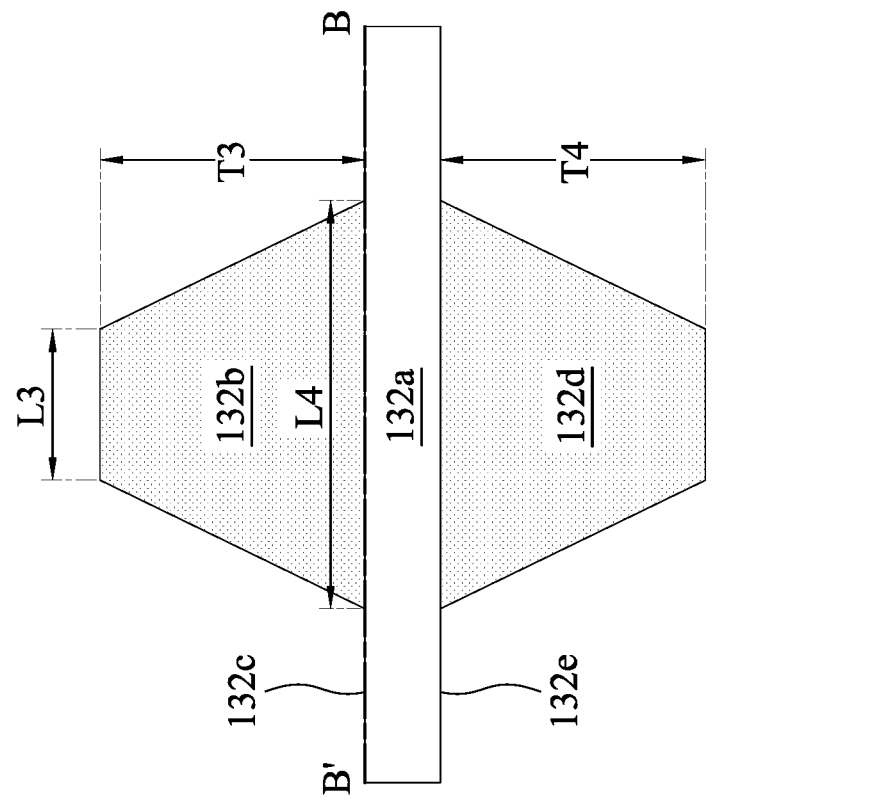

FIG. 9 is a cross-sectional view of the second filter along line B-B' in FIG. 7. In some embodiments, referring to FIG. 9, the third mesh 132b is formed on a first side 132c of the second membrane 132a, and a fourth mesh 132d is formed on a second side 132e opposite to the first side 132c of the second membrane 132a to increase a mechanical strength of the second filter 132. In some embodiments, a profile of struts of the fourth mesh 132d is trapezoidal from the cross-sectional view. In some embodiments, a thickness T4 of the fourth mesh 132d is less than 1 nm. In some embodiments, the profile of the struts of the fourth mesh 132d may be similar to or different from the profile of the struts of the third mesh 132b. In some embodiments, the second filter 132 is disposed on a rotatable carrier (not shown) and may be rotatable along with the rotatable carrier.

In some embodiments, referring back to FIG. 1, the EUV radiation 202 in the chamber 102 is guided to a semiconductor workpiece 151, such as a reticle, via one or more optical elements, such as the first mirror 141 and the second mirror 142. In some embodiments, the EUV radiation 202 passing through the first filter 131 and/or the second filter 132 is guided to the semiconductor workpiece 151, and a usable image with high resolution over a commensurate area of the semiconductor workpiece 151 is achieved. In some embodiments, an image of a surface of the semiconductor workpiece 151 is detected by a detector 161.

In some embodiments, a plurality of the first filters 131 are arranged at locations in the EUV light path 108. In some embodiments, a plurality of the second filters 132 are arranged at locations in the EUV light path 108. In some embodiments, the first filter 131 is omitted, and the second filter 132 is disposed in the chamber 102. In some embodiments, the second filter 132 is omitted, and the first filter 131 is disposed in the chamber 102. In some embodiments, one first filter 131 and the plurality of second filters 132 are arranged at locations in the EUV light path 108.

Figure 10:
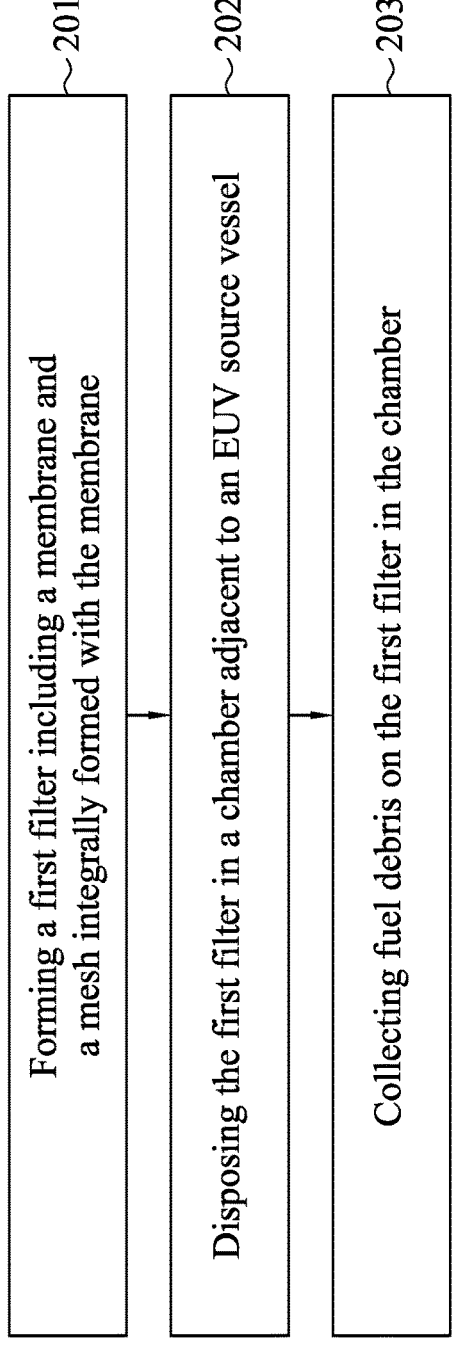
FIG. 10 is a flowchart of a method for generating EUV radiation in accordance with some embodiments of the present disclosure.

According to some embodiments of the present disclosure, a method for generating EUV radiation is disclosed. In some embodiments, the method 200 utilizes an EUV radiation source apparatus 100. The method 200 includes a number of operations, and the description and illustration are not deemed as a limitation to the sequence of operations. FIG. 10 is a flowchart of the method 200 in accordance with some embodiments. The method 200 includes a number of operations (201 to 203). Additional steps can be provided before, during, and after the steps shown in FIG. 10, and some of the steps described below can be replaced or eliminated in other embodiments of the method 200. The order of the steps may be interchangeable.

In operation 201, referring to FIG. 10, a first filter is formed, wherein the first filter includes a membrane and a mesh integrally formed with the membrane. In operation 202, the first filter is disposed in a chamber adjacent to an EUV source vessel. In operation 203, fuel debris is collected on the first filter in the chamber.

According to some embodiments of the present disclosure, another method for generating EUV radiation is disclosed. In some embodiments, the method 300 utilizes an EUV radiation source apparatus 100. The method 300 includes a number of operations, and the description and illustration are not deemed as a limitation to the sequence of operations. FIG. 11 is a flowchart of the method 300 in accordance with some embodiments. The method 300 includes a number of operations (301 to 308). Additional steps can be provided before, during, and after the steps shown in FIG. 11, and some of the steps described below can be replaced or eliminated in other embodiments of the method 300. The order of the steps may be interchangeable.

The method 300 begins with operation 301, in which a first filter 131 is formed, wherein the first filter 131 includes a first membrane 131a and a first mesh 131b integrally formed with the first membrane 131a. In some embodiments, the first filter 131 shown in FIG. 3 is provided. In some embodiments, the first membrane 131a and the first mesh 131b are formed simultaneously. In some embodiments, the first membrane 131a and the first mesh 131b are formed by etching a wafer. In some embodiments, operation 301 of the method 300 is similar to operation 201 of the method 200.

The method 300 continues with operation 302, in which an EUV light path 108 is provided in a chamber 102. In some embodiments, an EUV radiation source apparatus 100 is provided, wherein the EUV radiation source apparatus includes an EUV source vessel 101, a tin layer 112 disposed in the EUV source vessel 101, and the chamber 102 disposed adjacent to the EUV source vessel 101. In some embodiments, the EUV radiation source apparatus 100 shown in FIG. 1 is provided. In some embodiments, additional components may be enclosed in the EUV source vessel 101, but the disclosure is not limited thereto.

The method 300 continues with operation 303. Operation 303 includes providing a mirror in the chamber 102. In some embodiments, a first mirror 141 is disposed in the chamber 102.

The method 300 continues with operation 304. Operation 304 includes disposing the first filter 131 in the chamber 102 along the EUV light path 108, wherein the first filter 131 is disposed between the mirror and the EUV source vessel 101. In some embodiments, the first filter 131 is disposed between the tin layer 112 and the first mirror 141. In some embodiments, operation 304 of the method 300 is similar to operation 202 of the method 200.

The method 300 continues with operation 305. Operation 305 includes providing a semiconductor workpiece 151 in the chamber 102. In some embodiments, the semiconductor workpiece 151, such as a reticle, is disposed in the chamber 102. In some embodiments, a detector 161 is disposed in the chamber 102 and configured to detect an image of a surface of semiconductor workpiece 151.

The method 300 continues with operation 306. Operation 306 includes providing a second filter 132 between the first mirror 141 and the semiconductor workpiece 151. In some embodiments, the method 300 further includes forming the second filter 132 including a second membrane 132a and a third mesh 132b integrally formed with the second membrane 132a. In some embodiments, the second filter 132 shown in FIG. 7 is provided. In some embodiments, the second membrane 132a and the third mesh 132b are formed simultaneously. In some embodiments, the second membrane 132a and the third mesh 132b are formed by etching a wafer.

The method 300 continues with operation 307. Operation 307 includes transmitting EUV radiation 202 through the first filter 131 and the second filter 132.

In some embodiments, the method 300 further includes applying a laser beam 201 to strike the tin layer 112, thereby generating the EUV radiation 202 and forming fuel debris 203. In some embodiments, the method 300 further includes the EUV radiation 202 exiting the EUV radiation source apparatus 100. In some embodiments, the generation of the EUV radiation 202 and the exiting of the EUV radiation 202 are performed simultaneously.

In some embodiments, a first channel 105 and a second channel 106 are provided and respectively coupled to the EUV source vessel 101. The second channel 106 is in communication with the EUV source vessel 101 and the chamber 102. In some embodiments, the laser beam 201 is provided into the EUV source vessel 101 through the first channel 105. In some embodiments, the laser beam 201 passes through a first aperture 121 of a catcher 120 before striking the tin layer 112.

In some embodiments, the EUV radiation 202 exits the EUV radiation source apparatus 100 through the second channel 106 and enters the chamber 102. In some embodiments, the EUV radiation 202 passes through a second aperture 122 of the catcher 120 and enters the second channel 106. In some embodiments, after the EUV radiation 202 enters the chamber 102, the EUV radiation 202 passes through the first filter 131 and the second filter 132 and is guided to the semiconductor workpiece 151 in the chamber 102.

In some embodiments, when the first membrane 131a and the first mesh 131b are integrally formed, a transmittance of the first filter 131 is greater than 60%. In some embodiments, the transmittance of the first filter 131 is greater than 80%. In some embodiments, when the second membrane 132a and the third mesh 132b are integrally formed, a transmittance of the second filter 132 is greater than 70%. In some embodiments, the transmittance of the second filter 132 is greater than 75%. In some embodiments, a total transmittance of the first filter 131 and the second filter 132 is greater than 60%.

The method 300 continues with operation 308. Operation 308 includes collecting fuel debris 203 on the first filter 131 in the chamber 102. In some embodiments, when the tin layer 112 is struck by the laser beam 201, the fuel debris 203 generated from the collision may be collected by the catcher 120 and the first filter 131. The catcher 120 prevents the fuel debris 203 from splashing around the EUV source vessel 101, and the first filter 131 prevents the fuel debris 203 from splashing around the chamber 102.

In some embodiments, operations 307 and 308 can be performed simultaneously. In some embodiments, operation 308 of the method 300 is similar to operation 203 of the method 200.

Figure 12:
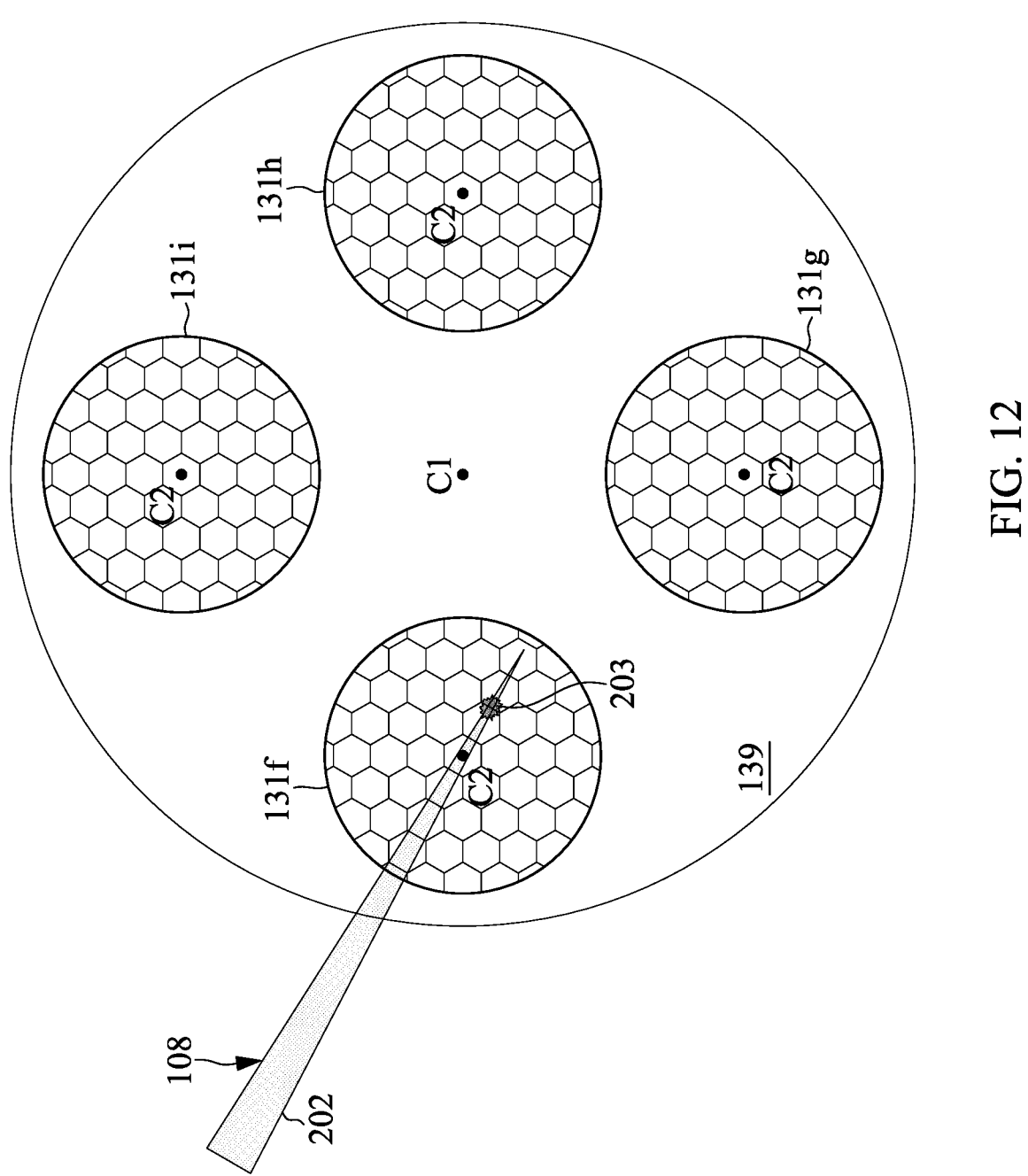
FIGS. 12 to 14 are schematic views of one or more operations of the method for generating EUV radiation in accordance with some embodiments of the present disclosure.
Figure 13:
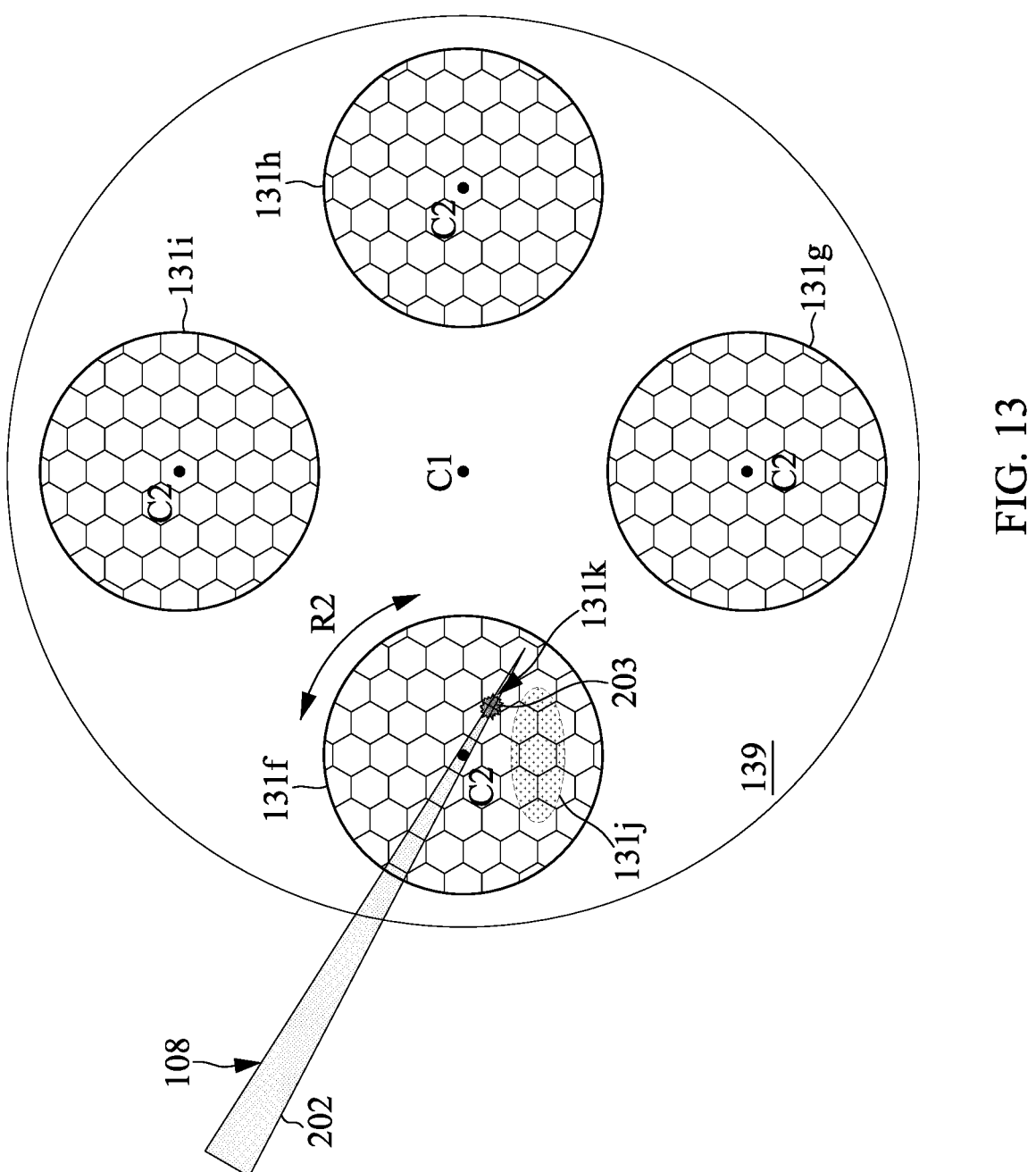
Figure 14:
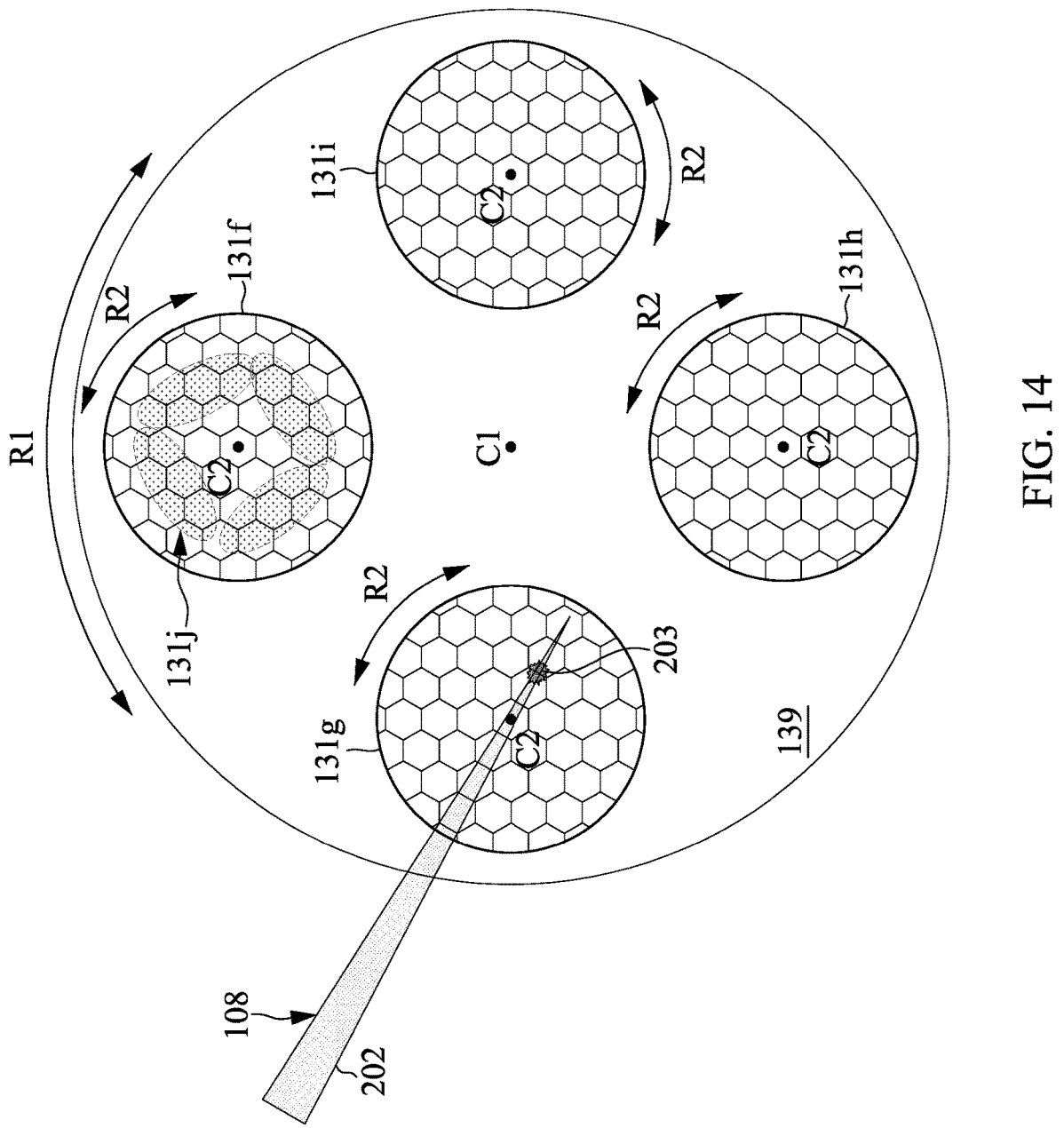

FIGS. 12 to 14 are schematic views of one or more operations of the method for generating EUV radiation in accordance with some embodiments of the present disclosure. In some embodiments, referring to FIG. 12, the method 300 further includes providing a plurality of first filters 131f, 131g, 131h and 131i in the chamber 102 and disposed on a carrier 139. In some embodiments, the plurality of first filters 131f, 131g. 131h and 131i and the carrier 139 shown in FIG. 6 are provided. In some embodiments, one of the first filters 131f disposed on the carrier 139 is disposed in the EUV light path 108, and the fuel debris 203 is collected on a portion of the first filter 131f. In some embodiments, referring to FIG. 13, when a used portion 131j of the first filter 131f has collected some of the fuel debris 203 and is considered used and contaminated, the first filter 131f rotates at the predetermined interval or rotates about the center C2, and the fuel debris 203 may be collected by a fresh portion 131k of the first filter 131f.

In some embodiments, referring to FIG. 14, when the first filter 131f in the EUV light path 108 has collected enough fuel debris 203 and is considered used and contaminated, the carrier 139 rotates at the predetermined interval or rotates about a center C1 to dispose the first filter 131g, which is fresh and unused, in the EUV light path 108. In some embodiments, after the first filters 131f, 131g, 131h and 131i in the chamber 102 are contaminated, the carrier and the first filters 131f, 131g, 131h and 131i are removed from the chamber 102.

One aspect of the present disclosure relates to an EUV radiation source apparatus. The EUV radiation source appa-ratus includes an EUV source vessel; a tin layer disposed in the EUV source vessel; a chamber disposed adjacent to the EUV source vessel; and a first filter disposed in the chamber, wherein the first filter includes a membrane and a mesh disposed on the membrane, and the membrane and the mesh are integrally formed.

In some embodiments, the EUV radiation source appara-tus further includes a first mirror disposed in the chamber, wherein the first filter is disposed between the tin layer and the first mirror. In some embodiments, the first filter is a debris filter and is configured to collect fuel debris generated from a collision of a laser beam and the tin layer. In some embodiments, the first filter includes silicon. In some embodiments, the EUV radiation source apparatus further includes a second mirror disposed in the chamber and adjacent to the first mirror, wherein the first filter is disposed between the first mirror and the second mirror. In some embodiments, the first filter is disposed at an aperture position. In some embodiments, the first filter is an out-of-band radiation filter. In some embodiments, the first filter includes silicon, EUV pellicles or zirconium. In some embodiments, the mesh is a hexagonal wire mesh. In some embodiments, a profile of a wire of the mesh is trapezoidal from a cross-sectional view. In some embodiments, the EUV radiation source apparatus further includes a second filter disposed adjacent to the first filter; and a rotatable carrier, wherein the first filter and the second filter are attached to the rotatable carrier.

An aspect of this disclosure relates to an EUV radiation source apparatus. The EUV radiation source apparatus includes a chamber; an EUV source configured to supply an EUV radiation through an exit port into the chamber; an EUV light path traveling along the chamber from the exit port; and a first filter located in the EUV light path and configured to allow the EUV radiation to pass through, wherein the first filter includes a first membrane and a first mesh integrally formed with the first membrane.

In some embodiments, the EUV radiation source appara-tus further includes a mirror located in the EUV light path and within the chamber, wherein the first filter is a debris filter and disposed between the mirror and the exit. In some embodiments, the EUV radiation source apparatus further includes a reticle disposed in the chamber, and a mirror located in the EUV light path and disposed between the reticle and the exit, wherein the first filter is an out of band radiation filter and disposed between the mirror and the reticle. In some embodiments, the EUV radiation source apparatus further includes a reticle disposed in the chamber, a mirror located in the EUV light path and disposed between the reticle and the exit, and a second filter disposed between the mirror and the reticle, wherein the first filter is disposed between the mirror and the exit, and the second filter includes a second membrane and a second mesh integrally formed with the second membrane.

An aspect of the present disclosure relates to a method for generating EUV radiation. The method includes forming a first filter including a membrane and a mesh integrally formed with the membrane; disposing the first filter in a chamber adjacent to an EUV source vessel; and collecting fuel debris on the first filter in the chamber.

In some embodiments, the method further includes pro-viding an EUV light path in the chamber, wherein the first filter is disposed at the EUV light path. In some embodi-ments, the method further includes disposing the first filter on a rotatable carrier in the chamber; disposing a second filter on the rotatable carrier and adjacent to the first filter; rotating the rotatable carrier after the fuel debris is collected on the first filter; and collecting the fuel debris on the second filter. In some embodiments, the method further includes transmitting an EUV radiation through the first filter, wherein a transmittance of the first filter is greater than 60%. In some embodiments, the method further includes providing a mirror in the chamber, wherein the first filter is disposed between the mirror and the EUV source vessel; providing a reticle in the chamber; a providing a second filter between the mirror and the reticle; and transmitting the EUV radiation through the first filter and the second filter, wherein a total transmittance of the first filter and the second filter is greater than 60%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source apparatus, comprising:
an EUV source vessel;
a tin layer disposed in the EUV source vessel;
a chamber disposed adjacent to the EUV source vessel;
a first filter disposed in the chamber, wherein the first filter is a debris filter and is configured to collect a first fuel debris generated from a collision of a laser beam and the tin layer; and
a rotatable carrier on which the first filter is disposed, wherein the rotatable carrier is configured to rotate the first filter about a center of the first filter so that a second fuel debris is collected on a fresh portion of the first filter, and
wherein the first filter includes a membrane and a mesh disposed on the membrane, and the membrane and the mesh are integrally formed.

2. The apparatus of claim 1, further comprising:
a first mirror disposed in the chamber,
wherein the first filter is disposed between the tin layer and the first mirror.

3. The apparatus of claim 2, wherein the first filter includes silicon.

4. The apparatus of claim 1, further comprising:
a first mirror disposed in the chamber; and
a second mirror disposed in the chamber and adjacent to the first mirror;
a second filter disposed between the first mirror and the second mirror.

5. The apparatus of claim 4, wherein the second filter is disposed at an aperture position.

6. The apparatus of claim 4, wherein the second filter is an out-of-band radiation filter.

7. The apparatus of claim 4, wherein the second filter includes silicon, EUV pellicles or zirconium.

8. The apparatus of claim 1, wherein the mesh is a hexagonal wire mesh.

9. The apparatus of claim 1, wherein a profile of a wire of the mesh is trapezoidal from a cross-sectional view.

10. The apparatus of claim 1, further comprising:
a second filter disposed adjacent to the first filter;

wherein the second filter is attached to the rotatable carrier.

11. An extreme ultraviolet (EUV) radiation source apparatus, comprising:
a chamber;
an EUV source configured to supply an EUV radiation having an EUV light path traveling along the chamber through an exit port;
a first filter located in the EUV light path and configured to allow the EUV radiation to pass through; and
a rotatable carrier on which the first filter is disposed, wherein the first filter is a debris filter, and the rotatable carrier is configured to rotate the first filter about a center of the first filter after a used portion of the first filter is contaminated by a fuel debris generated from the EUV source, and
wherein the first filter includes a first membrane and a first mesh integrally formed with the first membrane.

12. The apparatus of claim 11, further comprising:
a mirror located in the EUV light path and within the chamber,
wherein the first filter is disposed between the mirror and the exit port.

13. The apparatus of claim 11, further comprising:
a reticle disposed in the chamber;
a mirror located in the EUV light path and disposed between the reticle and the exit port;
a second filter,
wherein the second filter is an out-of-band radiation filter and is disposed between the mirror and the reticle.

14. The apparatus of claim 11, further comprising:
a reticle disposed in the chamber;
a mirror located in the EUV light path and disposed between the reticle and the exit port; and
a second filter disposed between the mirror and the reticle,
wherein the first filter is disposed between the mirror and the exit port, and the second filter includes a second membrane and a second mesh integrally formed with the second membrane.

15. A method for generating extreme ultraviolet (EUV) radiation, comprising:
forming a first filter including a membrane and a mesh integrally formed with the membrane;
disposing the first filter in a chamber adjacent to an EUV source vessel;
collecting a first fuel debris on a first portion of the first filter in the chamber;
rotating the first filter about a center of the first filter; and
collecting a second fuel debris on a second portion, different from the first portion, of the first filter.

16. The method of claim 15, further comprising:
providing an EUV light path in the chamber,
wherein the first filter is disposed in the EUV light path.

17. The method of claim 15, further comprising:
disposing the first filter on a rotatable carrier in the chamber;
disposing a second filter on the rotatable carrier and adjacent to the first filter;
rotating the rotatable carrier after the first fuel debris and the second fuel debris are collected on the first filter; and
collecting a third fuel debris on the second filter.

18. The method of claim 15, further comprising:
transmitting an EUV radiation through the first filter,
wherein a transmittance of the first filter is greater than 60%.

19. The method of claim 15, further comprising:

providing a mirror in the chamber, wherein the first filter is disposed between the mirror and the EUV source vessel;

providing a reticle in the chamber;

providing a second filter between the mirror and the reticle; and transmitting an EUV radiation through the first filter and the second filter, wherein a total transmittance of the first filter and the second filter is greater than 60%.

20. The method of claim 15, wherein the first filter is rotated at a predetermined interval.

\* \* \* \* \*